United States Patent
Brown et al.

(10) Patent No.: US 6,921,494 B2
(45) Date of Patent: Jul. 26, 2005

(54) BACKSIDE ETCHING IN A SCRUBBER

(75) Inventors: Brian J. Brown, Palo Alto, CA (US); Madhavi Chandrachood, Sunnyvale, CA (US); Radha Nayak, Santa Clara, CA (US); Fred C. Redeker, Fremont, CA (US); Michael Sugarman, San Francisco, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 89 days.

(21) Appl. No.: 10/456,723

(22) Filed: Jun. 6, 2003

(65) Prior Publication Data

US 2003/0209255 A1 Nov. 13, 2003

Related U.S. Application Data

(62) Division of application No. 09/636,779, filed on Aug. 11, 2000, now abandoned.
(60) Provisional application No. 60/148,987, filed on Aug. 14, 1999.

(51) Int. Cl.$^7$ .................... B44C 1/22; C03C 15/00; C03C 25/68; C23F 1/00
(52) U.S. Cl. .................... 216/88; 216/92; 134/902
(58) Field of Search .................... 216/91, 92, 100, 216/105; 156/345.11, 345.17, 345.21, 345.24; 134/1.3, 33, 902; 438/748, 753; 15/77, 88.2, 88.3, 88.4

(56) References Cited

U.S. PATENT DOCUMENTS

| | | | |
|---|---|---|---|
| 5,675,856 A | | 10/1997 | Itzkowitz |
| 5,709,755 A | * | 1/1998 | Kuo et al. .................... 134/1.3 |
| 5,716,458 A | | 2/1998 | Machino |
| 5,853,522 A | | 12/1998 | Krusell et al. |
| 5,904,301 A | | 5/1999 | Kajiyama et al. |
| 6,063,232 A | * | 5/2000 | Terasawa et al. ...... 156/345.23 |
| 6,080,675 A | | 6/2000 | Prall et al. |
| 6,187,684 B1 | | 2/2001 | Farber et al. |
| 6,202,658 B1 | | 3/2001 | Fishkin et al. |
| 6,277,203 B1 | | 8/2001 | Jiang et al. |
| 6,290,865 B1 | | 9/2001 | Lloyd et al. |
| 6,427,566 B1 | | 8/2002 | Jones et al. |
| 6,592,677 B1 | * | 7/2003 | Tomimori et al. ............. 134/3 |
| 6,711,775 B2 | * | 3/2004 | Mikhaylich et al. ........... 15/77 |
| 6,733,594 B2 | * | 5/2004 | Nguyen ......................... 134/6 |

FOREIGN PATENT DOCUMENTS

| | | |
|---|---|---|
| EP | 0 837 493 A2 | 4/1998 |
| EP | 0999012 | 10/2000 |
| JP | 63-221627 | 9/1988 |
| JP | 4-949537 | 3/1992 |
| JP | 10-335283 | 12/1998 |
| WO | WO 00/03419 | 1/2000 |
| WO | WO 00/33368 | 6/2000 |

* cited by examiner

Primary Examiner—P. Hassanzadeh
Assistant Examiner—Roberts Culbert
(74) Attorney, Agent, or Firm—Dugan & Dugan

(57) ABSTRACT

A scrubber device is provided. The scrubber device may etch a backside of a wafer and may clean a frontside of the wafer simultaneously. The scrubber device may comprise a programmed controller adapted to supply a non-etching fluid to a frontside of the wafer whenever an etching fluid is supplied to the backside of the wafer.

25 Claims, 1 Drawing Sheet

BACKSIDE ETCHING IN A SCRUBBER

Figure 1:
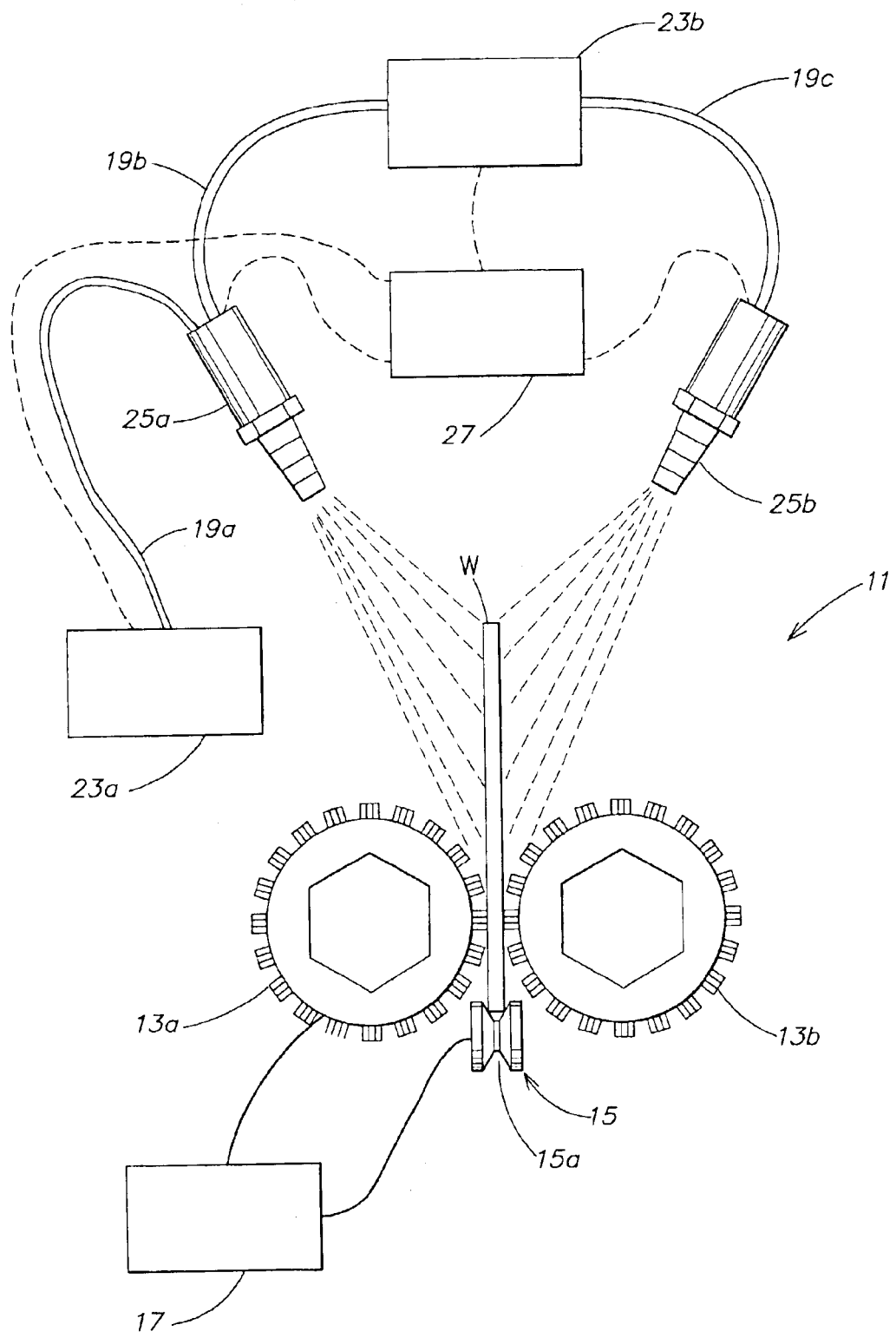

This application is a divisional of U.S. patent application Ser. No. 09/636,779 filed Aug. 11, 2000 now abandoned and this application claims the benifit of 60/148,987 filed on Aug. 14, 1999, which is hereby incorporated by reference herein in its entirety.

FIELD OF THE INVENTION

The present invention relates generally to apparatuses and methods for cleaning thin discs, such as semiconductor wafers, compact discs, glass substrates and the like. More particularly, the present invention relates to apparatuses and methods for simultaneously cleaning a frontside of a wafer and etching a backside of the wafer.

BACKGROUND OF THE INVENTION

A factory for manufacturing semiconductor substrates (e.g., patterned or unpatterned wafers) is conventionally known as a "FAB." Within the FAB, semiconductor wafers undergo processing steps, which include patterning the frontside of a wafer to form semiconductor circuitry. During patterning, which includes selective doping through photo-resist masks, depositing blanket or selective thin film layers, and selective etching of materials, scattered particles may accumulate on the backside of a wafer. The scattered particles may include ashed photo-resist, metals such as Cu, Ta, W, TaN, Ti, material from non-metallic depositions, etc. Conventionally, the backside of the wafer is etched to remove the scattered particles accumulated thereon. Thereafter, the wafer may be cleaned via a scrubbing device.

SUMMARY OF THE INVENTION

The present invention provides a scrubber adapted to simultaneously etch a backside of a wafer while cleaning a frontside of the wafer. The inventive scrubber may comprise a mechanism adapted to support the wafer, a scrubber brush adapted to contact a frontside of the wafer, a mechanism adapted to supply an etching fluid to a backside of the wafer (e.g., a fluid adapted to etch a material from the backside of the wafer), and a mechanism adapted to supply a non-etching fluid to the frontside of the wafer (e.g., deionized water, a cleaning fluid, a surfactant solution, or some other fluid adapted (1) to not etch the material; or (2) to etch the material at a slower rate than the etching fluid). It will be understood that whether or not a fluid is an etching fluid depends on the material to be etched by the fluid (e.g., an etching fluid may etch one material but not another). The scrubber may be horizontally or vertically oriented. In one aspect the scrubber is a double-sided scrubber, such that the etching of the wafer's backside is enhanced via contact with a scrubber brush. The scrubber may be programmed to perform simultaneous etching of a wafer's backside (e.g., via the etching fluid) and cleaning of the wafer's frontside (e.g., via the non-etching fluid). By simultaneously etching and cleaning a substrate within a single apparatus both footprint and wafer transfer time may be reduced. Fluid consumption may also be reduced.

In a further aspect, a frontside of a wafer (having a copper structure formed thereon) is cleaned and a backside of the wafer is etched. The frontside of the wafer is cleaned by applying a non-etching fluid that selectively etches oxide (e.g. a thin layer of oxide which may contain copper contaminants) from the frontside without etching copper (e.g., a copper filled via or line) from the frontside, and the backside of the wafer is etched (e.g., to remove copper contaminants) by applying to the backside of the wafer an etching fluid that etches copper.

Other features and aspects of the present invention will become more fully apparent from the following detailed description of the preferred embodiments, the appended claims and the accompanying drawings.

BRIEF DESCRIPTION OF THE PREFERRED EMBODIMENTS

FIG. 1 is a side schematic view of an inventive scrubber adapted to etch a backside of the wafer and to clean a frontside of the wafer.

DETAILED DESCRIPTION OF THE PREFERRED EMBODIMENTS

FIG. 1 is a side schematic view of an inventive scrubber 11 adapted to etch a backside of a wafer W and to clean a frontside of the wafer W. The inventive scrubber 11 shown in FIG. 1 is adapted to support a wafer in a vertical orientation, and is adapted to scrub both the front and the back sides of the wafer. An inventive scrubber may, however, support a wafer in other orientations, or may scrub only one side (front or back) of a wafer.

The inventive scrubber 11 comprises a pair of PVA brushes 13a, 13b. The inventive scrubber 11 also comprises a platform 15 for supporting the wafer W and a mechanism for rotating the pair of PVA brushes 13a, 13b. The platform 15 comprises a plurality of rollers 15a (only one shown), which may be configured to support the wafer W vertically with minimal contact and which may be adapted to rotate the wafer W. A motor 17 is coupled to the pair of PVA brushes 13a, 13b, and to the plurality of rollers 15a so as to selectively rotate the pair of PVA brushes 13a, 13b and the rollers 15a as disclosed in U.S. patent application Ser. No. 09/191,061 (AMAT No.: 2733/CMP/RKK) titled METHOD AND APPARATUS FOR CLEANING THE EDGE OF A THIN DISC, filed on Nov. 11, 1998, the entire disclosure of which is incorporated herein by this reference.

The inventive scrubber 11 also may include a plurality of liquid supply lines 19a–c, which are coupled to carry liquid from a liquid source 23a, 23b to the inventive scrubber 11. Above the pair of brushes 13a, 13b are a backside spray nozzle 25a and a frontside spray nozzle 25b. The backside spray nozzle 25a is coupled to an etching fluid source 23a, via the liquid supply line 19a so as to receive an etching fluid therefrom. The backside spray nozzle 25a also is coupled to a non-etching fluid source 23b, via the liquid supply line 19b so as to receive a non-etching fluid therefrom. The frontside spray nozzle 25b is coupled to receive the non-etching fluid from the non-etching fluid source 23b, via a liquid supply line 19c.

If the wafer W has a copper layer formed on the frontside thereof, the non-etching fluid may comprise a cleaning solution (e.g., 0.123% citric acid, 0.016% ammonium hydroxide and deionized water, or another solution such as those described in U.S. patent application Ser. No. 09/163,582, filed Sep. 30, 1998, the entire disclosure of which is incorporated herein by this reference, and U.S. patent application Ser. No. 09/359,141 filed Jul. 21, 1999 the entire disclosure of which is incorporated herein by this reference) or deionized water. To remove copper contamination, the etching fluid applied to the backside of the wafer W may include 0.13% citric acid, 0.016% ammonium hydroxide, 0.1 to 0.5% hydrogen peroxide (preferably 0.15%) and deionized water, although many other acid solutions may be employed (e.g., an acid mixed with an oxidant, or an oxidizing acid such as nitric acid or sulfuric acid). In fact, a chemistry that would cause damage to devices on the frontside of the wafer W may be used to etch material from the backside of the wafer W. In such applications, the scrubber's controller (described below) is programmed such that the etching fluid is applied to the wafer W's backside only when the non-etching fluid is being applied to the wafer W's frontside. Note that the backside spray nozzle 25a is positioned so as to spray only the backside of the wafer W, and that the frontside spray nozzle 25b is positioned so as to spray only the frontside of the wafer W. In practice however, some backside spray (e.g., etching fluid) may reach the frontside of the wafer W and some frontside spray (e.g., non-etching fluid) may reach the backside of the wafer W.

A controller 27 is coupled to both the backside spray nozzle 25a and to the frontside spray nozzle 25b. The controller 27 is also operatively coupled to the liquid sources 23a, 23b and contains a program for directing the liquids to be supplied to the inventive scrubber 11.

In operation, the brushes 13a, 13b are initially in an open position (not shown), a sufficient distance from each other so as to allow the wafer W to be inserted therebetween. Thereafter, the wafer W to be cleaned is positioned on the rollers 15a, between the brushes 13a, 13b and the brushes 13a, 13b assume a closed position (FIG. 1), sufficiently close to each other so as to both hold the wafer W in place therebetween and to exert a force on the frontside and the backside of the wafer W sufficient to achieve effective cleaning. Mechanisms (not shown) for moving the brushes 13a, 13b between the open and closed positions are well known in the art and are therefore not further described herein.

Once the brushes 13a, 13b are in the closed position, the rollers 15a and the brushes 13a, 13b begin to rotate. The brushes 13a, 13b may rotate in opposite directions, applying forces to the wafer W in a first direction (e.g., downward) while the wafer W rotates either clockwise or counterclockwise due to rotation of the roller 15a.

While the brushes 13a, 13b scrub the major surfaces of the wafer W, the backside spray nozzle 25a sprays the etching fluid on the wafer's W backside while the frontside spray nozzle 25b sprays the non-etching fluid (e.g., a cleaning solution or some other non-etching fluid on the wafer's W frontside, as shown. The combined action of the backside scrubber brush 13a of and the etching fluid supplied by the backside spray nozzle 25a may efficiently etch undesirable material from the backside of the wafer W (e.g., residual metals such as copper).

The controller 27 may be programmed such that as the wafer W's backside is being etched via the supply of etching fluid from the backside spray nozzle 25a, deionized water or a cleaning fluid is supplied to the frontside of the wafer W via the frontside spray nozzle 25b. Preferably, as the wafer W's backside is being etched, the frontside scrubber brush 13b scrubs the frontside of the wafer W and/or the backside scrubber brush 13a scrubs the backside of the wafer W. Any etching fluid which erroneously contacts the frontside of the wafer W is quickly rinsed and scrubbed away by the action of the frontside spray nozzle 25b and the frontside scrubber brush 13b. After etching is complete the non-etching fluid (e.g., deionized water or cleaning fluid) may be applied to the wafer W's backside via the backside spray nozzle 25a to thereby rinse away any remaining etching fluid and debris. During such a backside rinsing step, the backside may be scrubbed, and/or non-etching fluid (e.g., deionized water or cleaning fluid) may be applied to the wafer W's frontside (with or without additional scrubbing).

Accordingly, the wafer W may be simultaneously etched and cleaned in a single step. The simultaneous etching and cleaning may reduce processing time, and may reduce chemistry/fluid consumption, as the non-etching fluid applied to the frontside of the wafer W may serve both to aid wafer cleaning and to dilute or rinse away any etching fluid that reaches the wafer's frontside. Moreover, by providing a scrubber that both etches and cleans (e.g., a single processing module scrubber), whether or not etching and cleaning are performed simultaneously, less cleanroom area may be consumed.

The foregoing description discloses only the preferred embodiments of the invention, modifications of the above-disclosed apparatus and method which fall within the scope of the invention will be readily apparent to those of ordinary skill in the art. For instance, it will be understood by those of ordinary skill in the art, that other scrubber configurations such as horizontal scrubbers, and/or scrubbers which use rotating disk shaped brushes rather than roller brushes, may be employed with the use of a backside etching spray and a frontside cleaning or rinsing spray, and still fall within the scope of the present invention.

Similarly, the backside and frontside sprays (e.g., the etching fluid and the non-etching fluid) each may be applied via a single nozzle positioned on each side of the wafer W, as shown in FIG. 1, or via a plurality of nozzles positioned on each side of the wafer W. The nozzles may be positioned above, below or beside the scrubber brushes and may spray fluid either directly on the wafer W or onto the scrubber brushes 13a, 13b which then rotate bringing the fluid into contact with a surface of the wafer W. Alternatively, fluids may be supplied directly through a fluid supply means incorporated within the scrubber brushes 13a, 13b or may be dripped onto the wafer W or onto the scrubber brushes 13a, 13b. Although less effective, the backside scrubber brush 13a may be omitted.

Other fluids may be employed when cleaning/etching other materials, for instance, when scrubbing a wafer having an oxide formed thereon, for example, hydrofluoric acid may be applied to etch the backside of the wafer, and ammonia may be applied to clean the frontside of the wafer. Wafers having copper layers formed thereon may be etched with other acids (hydrochloric, sulfuric, nitric, citric, etc.) and an oxidant (hydrogen peroxide, ozone, etc.)

Accordingly, while the present invention has been disclosed in connection with the preferred embodiments thereof, it should be understood that other embodiments may fall within the spirit and scope of the invention, as defined by the following claims.

The invention claimed is:

1. A method of cleaning a frontside of a wafer and etching a backside of the wafer, comprising:

(1) scrubbing a frontside of a wafer positioned on a support mechanism;

(2) directing an etching fluid to a backside of the wafer positioned on the support mechanism; and (3) directing a non-etching fluid to the frontside of the wafer positioned on the support mechanism;

wherein the etching fluid etches a material from the backside of the wafer, and wherein the non-etching fluid does not etch the material from the front side of the wafer; and wherein directing an etching fluid to a backside of the wafer comprises directing etching fluid that would cause damage to devices on the frontside of the wafer if allowed to contact the same undiluted.

2. The method of claim 1, further comprising performing steps (1) and (3) simultaneously.

3. The method of claim 1, further comprising performing steps (1), (2) and (3) simultaneously.

4. The method of claim 1, wherein scrubbing a frontside of a wafer comprises scrubbing the frontside with a scrubber brush.

5. The method of claim 1, wherein directing an etching fluid to a backside of the wafer comprises removing particulate contaminants from the backside of the wafer.

6. The method of claim 1, wherein directing an etching fluid to a backside of the wafer comprises etching ashed photoresist.

7. The method of claim 1, wherein directing an etching fluid to a backside of the wafer comprises removing material from a prior non-metallic deposition.

8. The method of claim 1, wherein directing an etching fluid to a backside of the wafer comprises etching metallic structures.

9. The method of claim 8, wherein etching metallic structures comprises etching copper.

10. The method of claim 1, wherein directing an etching fluid to a backside of the wafer comprises dispensing etching fluid via a spray nozzle.

11. The method of claim 1, wherein directing an etching fluid to a backside of the wafer comprises dispensing etching fluid via a plurality of spray nozzles.

12. The method of claim 1, wherein directing an etching fluid to a backside of the wafer comprises dispensing etching fluid comprising an acid mixed with an oxidant.

13. The method of claim 1, wherein directing a non-etching fluid to the frontside of the wafer comprises diluting the etching fluid with the non-etching fluid.

14. The method of claim 1, wherein directing a non-etching fluid to the frontside of the wafer comprises rinsing etching fluid away from the front side.

15. The method of claim 1, wherein directing a non-etching fluid to the frontside of the wafer comprises directing non-etching fluid adapted to clean the frontside without etching a material the etching fluid etches.

16. The method of claim 1, wherein directing a non-etching fluid to the frontside of the wafer comprises directing non-etching fluid adapted to etch a material the etching fluid etches but at a slower rate than a rate at which the etching fluid etches the material.

17. The method of claim 1, wherein directing a non-etching fluid to the frontside of the wafer comprises dispensing the non-etching fluid via a spray nozzle.

18. The method of claim 1, wherein directing a non-etching fluid to the frontside of the wafer comprises dispensing a non-etching fluid comprising ammonium hydroxide and DI water.

19. The method of claim 1, wherein directing a non-etching fluid to the frontside of the wafer comprises dispensing a surfactant solution.

20. The method of claim 1, further comprising performing step (2) only while performing step (3).

21. The method of claim 1, further comprising:
   (4) directing a non-etching fluid to the backside of the wafer.

22. The method of claim 21, further comprising beginning to perform step (4) only after beginning to perform step (2).

23. The method of claim 21, further comprising beginning to perform step (4) only after completing step (2).

24. The method of claim 1, further comprising coordinating a timing of the performance of steps (1), (2) and (3) via a common controller.

25. The method of claim 24, wherein coordinating a timing of the performance of steps (1), (2) and (3) via a common controller comprises using the controller to prevent step (2) from being performed except while step (3) is being performed.

* * * * *